United States Patent
Su et al.

(10) Patent No.: US 9,978,681 B2
(45) Date of Patent: May 22, 2018

(54) SEMICONDUCTOR DEVICE

(71) Applicant: Taiwan Semiconductor Manufacturing Co., Ltd, Hsin-Chu (TW)

(72) Inventors: Hung-Wen Su, Hsinchu County (TW); Shih-Wei Chou, Taipei (TW); Ming-Hsing Tsai, Chu-Pei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days. days.

(21) Appl. No.: 14/837,458

(22) Filed: Aug. 27, 2015

(65) Prior Publication Data

US 2015/0371943 A1    Dec. 24, 2015

Related U.S. Application Data

(60) Continuation of application No. 12/787,559, filed on May 26, 2010, now Pat. No. 9,123,781, which is a division of application No. 11/210,226, filed on Aug. 23, 2005, now Pat. No. 7,749,896.

(51) Int. Cl.
*H01L 21/00* (2006.01)
*H01L 23/528* (2006.01)
*H01L 21/285* (2006.01)
*H01L 21/768* (2006.01)
*H01L 23/532* (2006.01)

(52) U.S. Cl.
CPC ........ *H01L 23/528* (2013.01); *H01L 21/2855* (2013.01); *H01L 21/28556* (2013.01); *H01L 21/28562* (2013.01); *H01L 21/7684* (2013.01); *H01L 21/76834* (2013.01); *H01L 21/76843* (2013.01); *H01L 21/76856* (2013.01); *H01L 21/76888* (2013.01); *H01L 23/53238* (2013.01); *H01L 23/53266* (2013.01); *H01L 2924/0002* (2013.01)

(58) Field of Classification Search
CPC .............. H01L 23/528; H01L 21/2855; H01L 21/28556
See application file for complete search history.

(56) References Cited

U.S. PATENT DOCUMENTS

| | | | |
|---|---|---|---|
| 5,676,587 A | 10/1997 | Landers et al. | |
| 6,136,680 A | 10/2000 | Lai et al. | |
| 6,146,988 A * | 11/2000 | Ngo .................. | H01L 21/76826 257/E21.576 |
| 6,221,792 B1 * | 4/2001 | Yang ................. | H01L 21/76843 438/649 |
| 6,245,663 B1 * | 6/2001 | Zhao ................. | H01L 21/76807 257/E21.579 |
| 6,319,766 B1 | 11/2001 | Bakli et al. | |

(Continued)

*Primary Examiner* — Laura Menz
(74) *Attorney, Agent, or Firm* — McClure, Qualey & Rodack, LLP

(57) ABSTRACT

Semiconductor devices and methods for forming the same in which damages to a low-k dielectric layer therein can be reduced or even prevented are provided. A semiconductor device is provided, comprising a substrate. A dielectric layer with at least one conductive feature therein overlies the substrate. An insulating cap layer overlies the top surface of the low-k dielectric layer adjacent to the conductive feature, wherein the insulating cap layer includes metal ions.

10 Claims, 4 Drawing Sheets

(56) References Cited

U.S. PATENT DOCUMENTS

| | | | |
|---|---|---|---|
| 6,335,283 B1* | 1/2002 | Ngo | H01L 21/76826 257/E21.576 |
| 6,372,636 B1 | 4/2002 | Chooi et al. | |
| 6,432,811 B1* | 8/2002 | Wong | H01L 21/02126 257/E21.273 |
| 6,458,650 B1* | 10/2002 | Huang | H01L 21/31116 257/E21.019 |
| 6,472,755 B1* | 10/2002 | Ngo | H01L 21/76826 257/639 |
| 6,500,770 B1* | 12/2002 | Cheng | H01L 21/02126 257/E21.273 |
| 6,599,827 B1 | 7/2003 | Ngo et al. | |
| 6,638,810 B2 | 10/2003 | Bakli et al. | |
| 6,641,632 B1* | 11/2003 | Ronay | C09G 1/02 106/3 |
| 6,686,273 B2* | 2/2004 | Hsu | H01L 21/76801 257/E21.576 |
| 6,696,360 B2* | 2/2004 | Ahn | H01L 21/2855 257/E21.169 |
| 6,717,265 B1 | 4/2004 | Ingerly et al. | |
| 6,753,250 B1 | 6/2004 | Hill et al. | |
| 6,762,500 B2* | 7/2004 | Ahn | H01L 21/2855 257/751 |
| 6,781,180 B1 | 8/2004 | Martin et al. | |
| 6,831,363 B2 | 12/2004 | Dalton et al. | |
| 6,864,181 B2* | 3/2005 | Redeker | H01L 21/7684 216/13 |
| 6,875,687 B1* | 4/2005 | Weidman | C23C 16/325 257/759 |
| 6,908,863 B2* | 6/2005 | Barns | H01L 21/31053 257/E21.244 |
| 6,916,737 B2 | 7/2005 | Jung et al. | |
| 6,924,227 B2* | 8/2005 | Minamihaba | C09G 1/02 438/633 |
| 6,984,581 B2* | 1/2006 | Wong | H01L 21/76807 257/E21.579 |
| 7,030,016 B2* | 4/2006 | Feng | H01L 21/76877 257/E21.585 |
| 7,109,557 B2* | 9/2006 | Barns | H01L 21/31053 257/244 |
| 7,115,995 B2* | 10/2006 | Wong | H01L 21/02126 257/751 |
| 7,119,019 B2 | 10/2006 | O'Brien | |
| 7,186,643 B2* | 3/2007 | Ahn | H01L 21/2855 257/E21.169 |
| 7,193,325 B2* | 3/2007 | Wu | H01L 21/02126 257/751 |
| 7,196,423 B2 | 3/2007 | Wu et al. | |
| 7,199,043 B2 | 4/2007 | Park | |
| 7,202,162 B2 | 4/2007 | Lin et al. | |
| 7,232,765 B1 | 6/2007 | Avanzino et al. | |
| 7,271,700 B2 | 9/2007 | Chinthakindi | |
| 7,309,658 B2* | 12/2007 | Lazovsky | B82Y 30/00 257/E21.251 |
| 7,723,226 B2* | 5/2010 | Yu | H01L 21/7682 257/2 |
| 7,749,896 B2* | 7/2010 | Su | H01L 21/28562 438/627 |
| 9,123,781 B2* | 9/2015 | Su | H01L 21/28562 |
| 2002/0074663 A1* | 6/2002 | Wong | H01L 21/02126 257/759 |
| 2002/0079583 A1* | 6/2002 | Wong | H01L 21/76807 257/758 |
| 2002/0130419 A1* | 9/2002 | Ahn | H01L 21/2855 257/762 |
| 2002/0132468 A1* | 9/2002 | Wong | H01L 21/02126 438/627 |
| 2002/0132474 A1* | 9/2002 | Ahn | H01L 21/2855 438/643 |
| 2003/0060036 A1* | 3/2003 | Hsu | H01L 21/76801 438/637 |
| 2003/0114004 A1* | 6/2003 | Sato | B23H 5/08 438/689 |
| 2004/0192030 A1* | 9/2004 | Redeker | H01L 21/288 438/638 |
| 2004/0219796 A1* | 11/2004 | Wu | H01L 21/31116 438/709 |
| 2004/0227243 A1* | 11/2004 | Perng | H01L 21/76843 257/751 |
| 2004/0229453 A1* | 11/2004 | Perng | H01L 21/76843 438/622 |
| 2004/0248398 A1* | 12/2004 | Ahn | H01L 21/2855 438/629 |
| 2004/0256351 A1* | 12/2004 | Chung | C23C 16/34 216/13 |
| 2005/0042861 A1* | 2/2005 | Redeker | H01L 21/288 438/638 |
| 2005/0070061 A1* | 3/2005 | Barns | H01L 21/31053 438/232 |
| 2005/0070093 A1* | 3/2005 | Barns | H01L 21/31053 438/637 |
| 2005/0212135 A1 | 9/2005 | Wu et al. | |
| 2005/0227479 A1* | 10/2005 | Feng | H01L 21/76877 438/637 |
| 2006/0134921 A1* | 6/2006 | Wu | H01L 21/31116 438/710 |
| 2006/0138668 A1* | 6/2006 | Su | H01L 21/288 257/762 |
| 2006/0186549 A1 | 8/2006 | Usami et al. | |
| 2006/0216930 A1* | 9/2006 | Feng | H01L 21/76877 438/637 |
| 2006/0261483 A1* | 11/2006 | Tsumura | H01L 21/76808 257/758 |
| 2006/0289993 A1* | 12/2006 | Ahn | H01L 21/2855 257/751 |
| 2007/0018330 A1 | 1/2007 | Takeda et al. | |
| 2007/0052096 A1* | 3/2007 | Su | H01L 21/28562 257/744 |
| 2007/0182014 A1 | 8/2007 | Usami et al. | |
| 2008/0171431 A1* | 7/2008 | Yu | H01L 21/7682 438/618 |
| 2009/0209106 A1* | 8/2009 | Su | H01L 21/2855 438/696 |
| 2010/0230816 A1* | 9/2010 | Su | H01L 21/28562 257/751 |
| 2011/0163424 A1* | 7/2011 | Lazovsky | B82Y 30/00 257/632 |
| 2011/0175228 A1* | 7/2011 | Lazovsky | B82Y 30/00 257/768 |
| 2012/0070915 A1* | 3/2012 | Bei | H01L 21/02299 438/14 |
| 2015/0371943 A1* | 12/2015 | Su | H01L 21/28562 257/751 |

\* cited by examiner

SEMICONDUCTOR DEVICE

CROSS REFERENCE TO RELATED APPLICATIONS

This application is a Continuation Application of allowed U.S. patent application Ser. No. 12/787,559, filed on May 26, 2010, (now U.S. Pat. No. 9,123,781) entitled "SEMICONDUCTOR DEVICE AND METHOD FOR FORMING THE SAME", which is a Divisional of granted U.S. patent application Ser. No. 11/210,226, filed on Aug. 23, 2005 (now U.S. Pat. No. 7,749,896, issued on Jul. 6, 2010), entitled "SEMICONDUCTOR DEVICE AND METHOD FOR FORMING THE SAME", the entireties of which are incorporated by reference herein.

BACKGROUND

The present invention relates to semiconductor fabrication, and in particular to semiconductor devices in which damages to a low-k dielectric layer therein can be reduced or even prevented and methods for forming the same.

Reduction of integrated circuit size has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solve this problem of high capacitance is to replace the conventional silicon oxide ($SiO_2$) dielectric material, having a dielectric constant (k) of about 4.0, with another insulation material having a lower dielectric constant to thereby lower the capacitance.

Unfortunately, low-k dielectric materials have characteristics that make it difficult to integrate into existing integrated circuit structures and processes. Compared to the conventional silicon dioxide ($SiO_2$), the low-k materials, due to the inherent properties thereof, typically have disadvantages such as low mechanical strength, high moisture absorption, poor adhesion, and instable stress level. Thus, replacement of conventional silicon dioxide ($SiO_2$) with low-k dielectric material in integrated circuit processes or structures becomes problematic, resulting in undesirable reliability problems due to physical damage to the low-k materials.

FIGS. 1-4 are cross sections showing fabrication steps of a conventional damascene process for forming interconnects, illustrating occurrence of undesired low-k dielectric damage therein.

In FIG. 1, a silicon substrate having semiconductor devices and/or other existing conductive features is provided with a low-k dielectric layer 10 thereon, with only the low-k dielectric layer 10 illustrated here for simplicity. The low-k dielectric layer 10 comprises low-k dielectric with an inherent dielectric constant less than that of undoped silicon dioxide (about 4.0).

The low-k dielectric layer 10 is then processed by, for example, a conventional single damascene process to form a plurality of openings op, filled by a bulk copper layer 14 formed thereon. A diffusion barrier layer 12, such as a tantalum nitride (TaN) layer, is conformably formed between the low-k dielectric layer 10 and the bulk copper layer 14 to prevent dopants or metal ions in the bulk copper layer 14 from diffusing into the low-k dielectric layer 10.

In FIG. 2, a first chemical mechanical polishing (CMP) is performed to remove the portion of the bulk copper layer 14 above the diffusion barrier layer 12 and stops on the diffusion barrier layer 12, leaving the copper layer 14a in the openings op.

Next, in FIG. 3, a second CMP is performed to remove the portion of the diffusion barrier layer 12 over the top surface of the low-k dielectric layer 10 and stops on the low-k dielectric layer 10.

Next, in FIG. 4, a third CMP is performed to polish the low-k dielectric layer 10, removing a portion of the low-k dielectric layer 10 to prevent conductive residue of the diffusion barrier layer 12 and/or the bulk conductive layer 14a from remaining on the top surface of the low-k dielectric layer 10, forming a plurality of conductive features S in the low-k dielectric layer 10. Each conductive feature S comprises a diffusion barrier layer 12a and a copper layer 14a which may function as an interconnect, such as contact plug or conductive line.

Due to inherently poor mechanical strength of the low-k material, the low-k dielectric layer 10 is damaged and lowered to a depth d1 of more than 200 Å below the top surface of the remaining copper layer 14a during the described second and third CMP processes, thus forming interconnects with an uneven surface conformation, as shown in FIG. 4. The uneven surface conformation of the formed interconnects makes it undesirable for substantial fabrication processes and may cause reliability problems in completed semiconductor devices.

SUMMARY

Semiconductor devices and methods for forming the same in which damages to a low-k dielectric layer therein can be reduced or even prevented are provided. An exemplary method for forming semiconductor devices is provided, comprising providing a dielectric layer with at least one opening therein. A conductive barrier layer is formed over the dielectric layer and the opening. The opening is filled by a conductor over the conductive barrier layer. The exposed portion of the conductive barrier layer is converted into a substantially insulating film.

Another method for forming semiconductor devices is provided, comprising providing a low-k dielectric layer with at least one opening therein. A conductive diffusion barrier layer is conformably formed over the low-k dielectric layer and the opening, wherein the conductive diffusion barrier layer has a thickness less than 10 Å. A conductive layer is formed over the low-k dielectric layer, filling the opening. The portion of the conductive layer above the low-k dielectric layer and the portion of the diffusion barrier over the low-k dielectric layer are removed thereby exposing the top surface of the low-k dielectric layer and forming at least one conductive feature.

In addition, a semiconductor device is provided, comprising a substrate. A low-k dielectric layer with at least one conductive feature therein overlies the substrate. An insulating cap layer overlies the top surface of the low-k dielectric layer adjacent to the conductive feature, wherein the insulating cap layer comprises metal ions.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. In addition, by use of the term "low dielectric constant" or "low-k" herein, is meant a dielectric constant (k value) which is less than the dielectric constant of a conventional silicon oxide. Preferably, the dielectric constant of the low-k is less than about 4.0.

Figure 1:
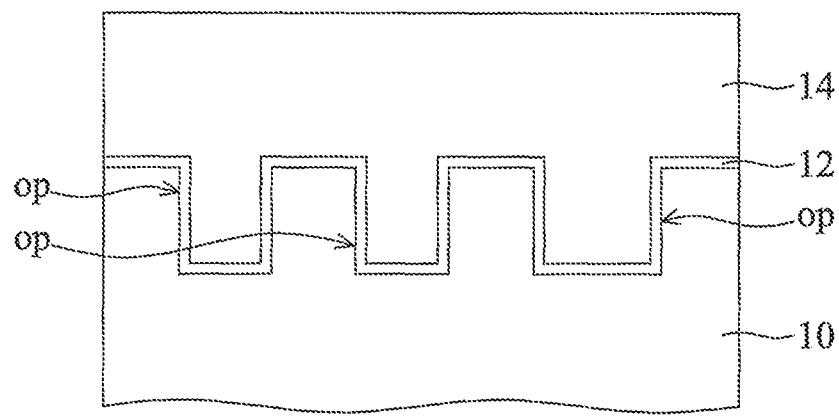
FIGS. 1-4 are cross sections showing fabrication steps of a conventional damascene scheme for forming interconnects, illustrating undesired dielectric damages.
Figure 2:
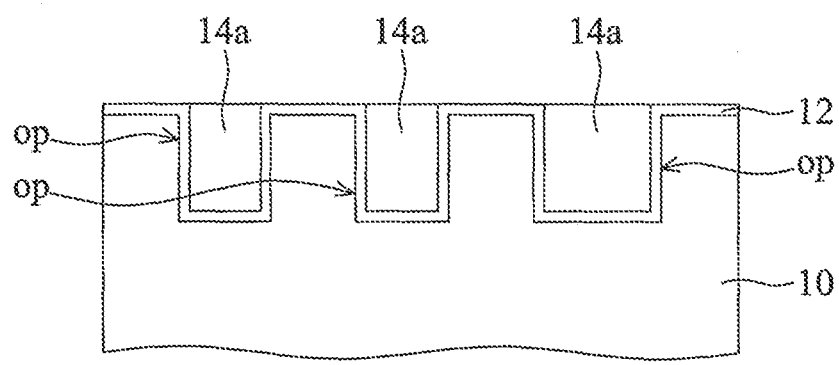
Figure 3:
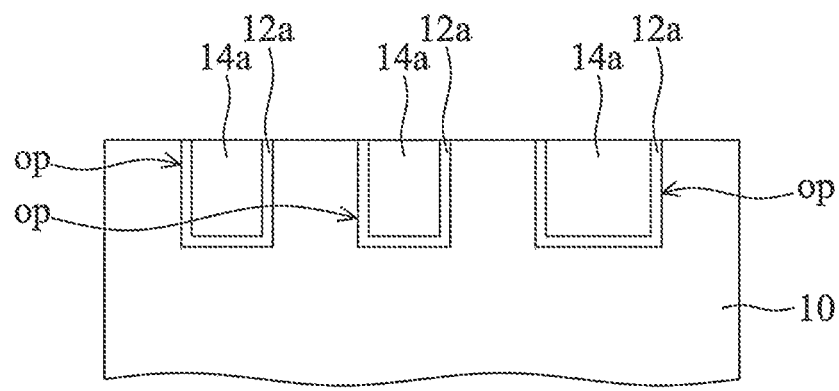
Figure 4:
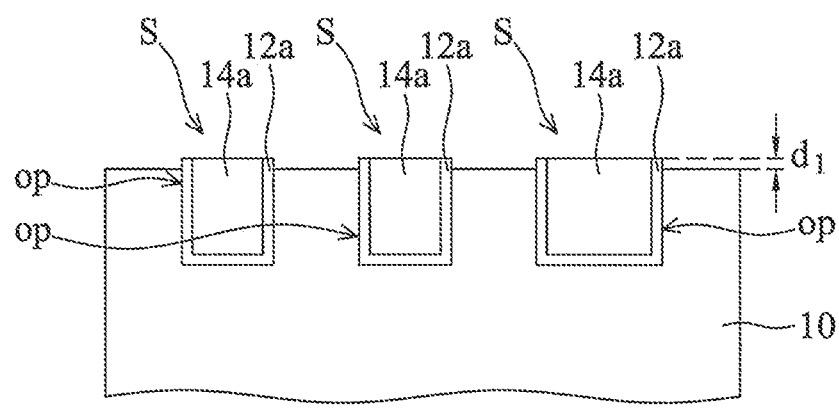
Figure 5:
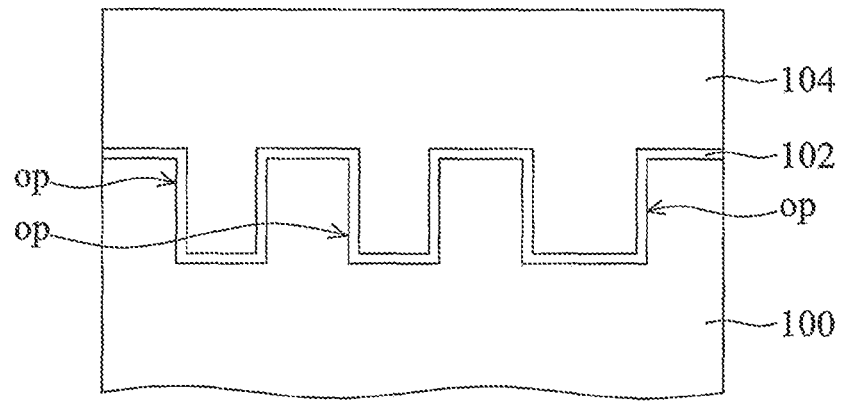
FIGS. 5-6 are cross sections showing fabrication steps of a method for forming semiconductor devices according to an embodiment of the invention.
Figure 6:
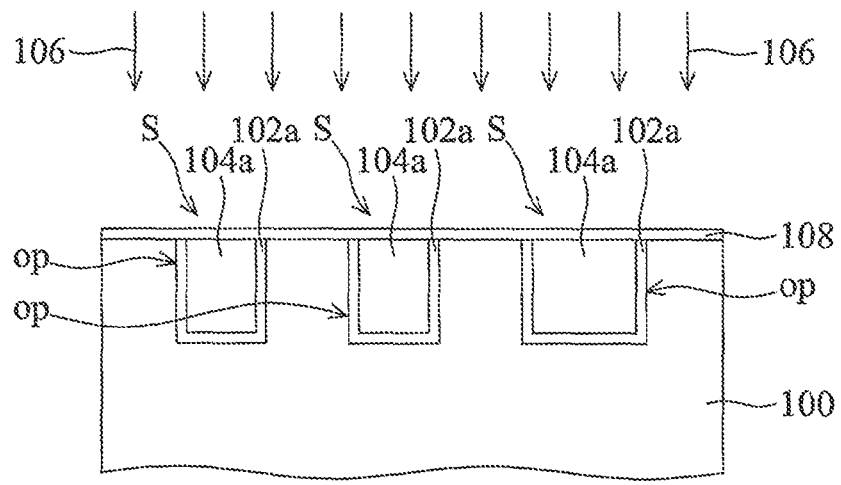

FIGS. 5-6 are cross sections showing fabrication steps of a method for forming semiconductor devices, wherein conventional physical damage to a dielectric layer therein is prevented.

In FIG. 5, a semiconductor substrate, for example a silicon substrate, having semiconductor devices and/or other existing conductive lines, is provided with a dielectric layer 100 thereon, with only the dielectric layer 100 illustrated here for simplicity. The dielectric layer 100 preferably comprises a low-k dielectric with an inherent dielectric constant less than that of undoped silicon dioxide (about 4.0). Examples of low-k dielectrics are carbon-doped silicon dioxide, fluorinated silicate glass (FSG), organic polymeric thermoset materials, silicon oxycarbide, SiCOH dielectrics, fluorine doped silicon oxide, spin-on glasses, silsesquioxane, benzocyclobutene (BCB)-based polymer dielectrics and any silicon containing low-k dielectric. Preferably, the low-k dielectrics of dielectric layer 100 are filled with pores to form a porous low-k with a total porosity, or void fraction of about 15-25% for further lowering the inherent k value thereof. For comparison, material without pores has a total porosity of zero.

The dielectric layer 100 is then processed by, for example, a conventional single damascene process to form a plurality of openings op with a bulk conductive layer 104 thereon, filling the openings op. A diffusion barrier layer 102 conformably formed between the low-k dielectric layer 100 and the bulk conductive layer 104 prevents conductive dopants or metal ions of the bulk conductive layer 104 from diffusing into the low-k dielectric layer 100. Normally, the diffusion barrier layer 102 comprises electrically conductive material such as tantalum nitride (TaN) or the like. The diffusion barrier layer 102 can be formed by physical vapor deposition (PVD) such as sputtering at a thickness of about 300 Å, normally between 100-500 Å. The bulk conductive layer 104 may comprise, for example, copper or tungsten and is formed by methods such as electroplating or electroless plating.

In FIG. 6, a planarization process (not shown) such as CMP or electropolishing is then performed to remove the portion of the bulk conductive layer 104 above the diffusion barrier layer 102 and stops on the diffusion barrier layer 102, leaving the conductive layer 104a in the openings OP. The electropolishing process can be, for example, an electrolysis process. Next, a treatment 106 is performed on the portion of the diffusion barrier layer 102 and the conductive layer 104a near the top surface for converting thereof into insulating dielectrics, forming a cap layer 108 overlying the top portion of the dielectric layer 100 and a plurality of underlying conductive features S in the dielectric layer 100. Each conductive feature S comprises a conductive layer 104a surrounded by a diffusion barrier layer 102a and may function as a conductive line or a contact plug. The portion of the cap layer 108 formed over conductive features S may be further defined and partially or entirely removed in sequential fabrication steps to thereby provide connections to devices formed thereon, leaving the portion of the cap layer substantially overlying the dielectric layer 100 between the conductive features (not shown).

In the treatment 106, a plasma comprising reactants such as N2, O2, or combination thereof and the like is used to treat the exposed portion of the diffusion barrier layer 102 and the conductive layer 104a at a power of about 0-250 watts (W) and a pressure of about 0.5-10 torr for conversion to a cap layer 108 of dielectric material. Gas flows of the reactants used in the treatment can be respectively between, for example, 10 sccm and 100 sccm when using N2 and O2. The cap layer 108 can function as an etch stop layer (ESL) for sequential processes. Therefore, the cap layer 108 is transformed to a dielectric layer to thereby insulate the adjacent conductive features S. The cap layer may comprise nitride, oxide, or oxynitride of a metal or metal compound which depending to materials used in the diffusion barrier layer and the reactants used in the treatment 106. Also, the cap layer may comprise metal ions of a trance amount about 10 Å or less since the diffusion barrier layer always comprises metal.

Compared with the convention damascene process illustrated in FIGS. 1-4, two CMP steps are omitted in this example, reducing additional costs for planarizing the diffusion barrier layer and dielectric layer, especially when using low-k dielectrics. In addition, dielectric damage to the underlying dielectric layer 100 caused by described CMP processes when using low-k dielectrics is also prevented, thus leaving the dielectric layer 100 with a substantially planar conformation. Reliability of the conductive features S is ensured and an easier and more cost-effective method for forming interconnects is provided.

Figure 7:
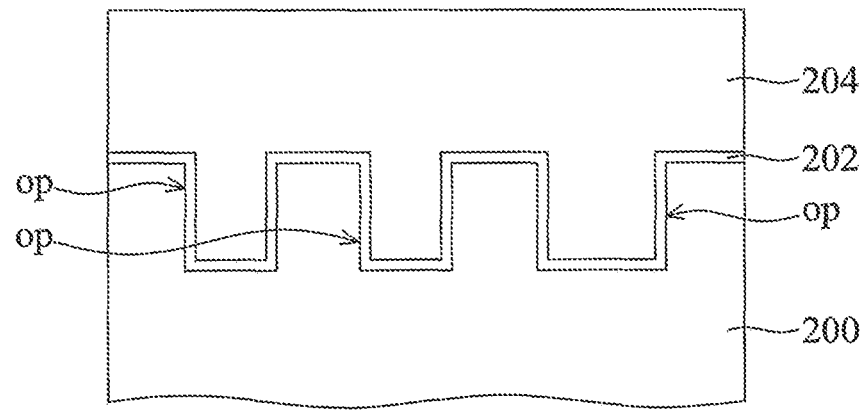
FIGS. 7-8 are cross sections showing fabrication steps of a method for forming semiconductor devices according to another embodiment of the invention.
Figure 8:
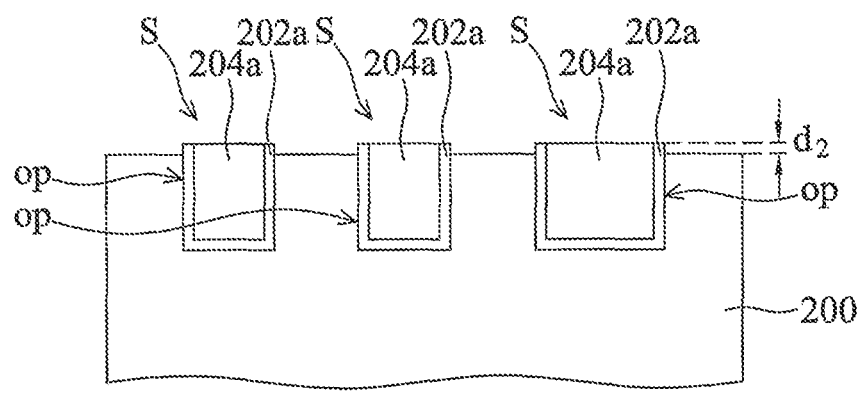

FIGS. 7-8 are cross sections showing fabrication steps of another method for forming semiconductor devices, wherein occurrence of undesirable dielectric layer damage therein is reduced.

In FIG. 7, a semiconductor substrate such as a silicon substrate, having semiconductor devices and/or other existing conductive lines, is provided with a dielectric layer 200 thereon, with only the dielectric layer 200 illustrated here for simplicity. The dielectric layer 200 preferably comprises a low-k dielectric with an inherent dielectric constant less than that of the undoped silicon dioxide (about 4.0). Examples of low-k dielectrics are the same as the dielectric layer 100 and not mentioned here again, for simplicity.

The dielectric layer 200 is then processed by, for example, a conventional single damascene process to form openings op, filled by a bulk conductive layer 204 thereon. A diffusion barrier layer 202 conformably between the dielectric layer 200 and the bulk conductive layer 204 prevents conductive dopants or metal ions of the bulk conductive layer 204 from diffusing into the dielectric layer 200. Normally, the diffusion barrier layer 202 comprises electrically conductive material such as tantalum nitride (TaN). Here, the diffusion barrier layer 202 is formed by atomic layer deposition (ALD) and has a thickness of less than 10 Å, preferably between 2-8 Å. The bulk conductive layer 204 may comprise, for example, copper or tungsten and is formed by methods such as electroplating or electroless plating.

In FIG. 8, CMP (not shown) is then performed to remove the portion of the bulk conductive layer 204 above the diffusion barrier layer 202 and stops on the dielectric layer 200, thereby leaving the conductive layer 204a in the openings OP. Each conductive feature S comprises a conductive layer 204a surrounded by a diffusion barrier layer 202a and can function as a conductive line or a contact plug.

Unlike convention damascene process illustrated in FIGS. 1-4, only a single CMP process is performed in this example and two CMP steps are omitted, reducing additional costs for planarizing the diffusion barrier layer and the low-k dielectric layer. In addition, dielectric damage to the underlying dielectric layer 200 caused by CMP can be reduced to a depth d2 less than 100 Å below the top surface of the remaining conductive layer 204a, leaving an substantially plane surface conformation, as shown in FIG. 8. This is especially desired when the dielectric layer 200 using low-k dielectrics. The substantially planar surface conformation of the formed semiconductor devices makes it desirable for substantial fabrication processes. Reliability of the conductive features S is ensured and an easier and more cost-effective method for forming interconnects is provided.

The described methods for forming semiconductor devices like interconnects in which damages to a dielectric layer therein is reduced or even prevented are illustrated in a single damascene scheme but not restricted thereto, the described methods are also applicable for dual damascene scheme or other schemes known by those skilled in the art.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate;
a low-k dielectric layer on the semiconductor substrate; and
a conductive feature in the low-k dielectric layer, wherein the conductive feature comprises a diffusion barrier layer and a conductive layer made of tungsten, and wherein a difference exists between a surface of the low-k dielectric layer and a surface of the diffusion barrier layer,
wherein a thickness of the diffusion barrier layer is less than 10 Å,
wherein the top surface of the low-k dielectric layer is about 100 Å lower than a top surface of the conductive layer made of tungsten, and the top surface of the conductive layer made of tungsten is higher than and without overlying the top surface of the low-k dielectric layer.

2. The semiconductor device of claim 1, wherein the diffusion barrier layer comprises TaN.

3. The semiconductor device of claim 1, where the diffusion barrier layer is formed by atomic layer deposition.

4. The semiconductor device of claim 1, wherein a sidewall of the diffusion barrier layer is partially surrounded by the low-k dielectric layer.

5. The semiconductor device of claim 1, wherein the low-k dielectric layer comprises porous low-k materials.

6. The semiconductor device of claim 1, wherein a dielectric constant of the low-k dielectric layer is less than 4.

7. The semiconductor device of claim 1, wherein the diffusion barrier layer is located between sidewalls of the conductive layer made of tungsten and the low-k dielectric layer and between a bottom surface of the conductive layer made of tungsten and the low-k dielectric layer, and the top surface of the conductive layer made of tungsten is substantially level with a top surface of the diffusion barrier layer.

8. The semiconductor device of claim 7, wherein the difference existing between the surface of the low-k dielectric layer and the surface of the diffusion barrier layer is measured from the top surface of the diffusion barrier layer to the top surface of the low-k dielectric layer.

9. A semiconductor device, comprising:
a semiconductor substrate;
a low-k dielectric layer on the semiconductor substrate; and
a conductive feature in the low-k dielectric layer, wherein the conductive feature comprises a diffusion barrier layer and a conductive layer made of tungsten, and wherein a difference exists between a surface of the low-k dielectric layer and a surface of the diffusion barrier layer, and wherein a top surface of the low-k dielectric layer is lower than a top surface of the diffusion barrier layer,
wherein a thickness of the diffusion barrier layer is less than a first value, a distance between the top surface of the low-k dielectric layer and a top surface of the conductive layer made of tungsten is less than a second value, which is larger than the first value,
wherein a thickness of the diffusion barrier layer is less than 10 Å,
wherein the surface of the low-k dielectric layer is about 100 Å lower than a surface of the conductive layer made of tungsten, which is positioned above and without overlying the surface of the low-k dielectric layer.

10. The semiconductor device of claim 9, wherein the second value is about 100 Å.

* * * * *